(12) United States Patent
Wajima

(10) Patent No.: US 6,525,449 B1
(45) Date of Patent: *Feb. 25, 2003

(54) PIEZOELECTRIC RESONATOR UTILIZING A HARMONIC IN A THICKNESS-EXTENSIONAL VIBRATION MODE

(75) Inventor: Masaya Wajima, Shinminato (JP)

(73) Assignee: Murata Manufacturing Co., Ltd., Kyoto (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/190,643

(22) Filed: Nov. 12, 1998

(30) Foreign Application Priority Data

Dec. 4, 1997 (JP) ................................. 9-334027

(51) Int. Cl.⁷ ................................................ H01L 41/04
(52) U.S. Cl. ........................................ 310/365; 310/320
(58) Field of Search ................................. 310/320, 365

(56) References Cited

U.S. PATENT DOCUMENTS

| 3,382,381 A | * | 5/1968 | Horton ........................ 310/365 |
| 4,384,229 A | * | 5/1983 | Inoue et al. ................. 310/315 |
| 4,757,581 A | * | 7/1988 | Yamada et al. ............. 29/25.35 |
| 4,870,313 A | * | 9/1989 | Hirama et al. .............. 310/320 |
| 5,045,744 A | * | 9/1991 | Ando et al. ................. 310/320 |
| 5,926,968 A | * | 7/1999 | Yachi et al. ................. 310/320 |

FOREIGN PATENT DOCUMENTS

| JP | 50-29191 | 3/1975 |
| JP | 53-36494 | 4/1978 |
| JP | 63-284920 | 11/1988 |
| JP | 2-78313 | 3/1990 |
| JP | 2-140008 | 5/1990 |
| JP | 4-216208 | 8/1992 |
| JP | 6-209225 | 7/1994 |

\* cited by examiner

Primary Examiner—Nestor Ramirez
Assistant Examiner—Peter Medley
(74) Attorney, Agent, or Firm—Keating & Bennett, LLP

(57) ABSTRACT

In an energy-trapping piezoelectric resonator which utilizes a harmonic in a thickness-extensional vibration mode, first and second excitation electrodes are provided partially on both major surfaces of a piezoelectric substrate such that they are opposed to each other on the front and rear surfaces via the piezoelectric substrate. First and second lead electrodes are connected to the first and second excitation electrodes, and first and second terminal electrodes provided along edges of the piezoelectric substrate are connected to the first and second lead electrodes, respectively. A spurious suppressing electrode section is connected to a portion of at least one of the first and second lead electrodes.

17 Claims, 13 Drawing Sheets

PIEZOELECTRIC RESONATOR UTILIZING A HARMONIC IN A THICKNESS-EXTENSIONAL VIBRATION MODE

BACKGROUND OF THE INVENTION

1. Field of the Invention

The present invention relates to thickness-extensional piezoelectric resonators which utilize harmonics in a thickness extensional vibration mode, and more particularly, to a thickness-extensional piezoelectric resonator which suppresses spurious resonances caused by a fundamental wave, via an improved electrode shape.

2. Description of the Related Art

As a MHz-band piezoelectric resonator used for generating a clock signal for a microcomputer, for example, a piezoelectric resonator utilizing a harmonic in a thickness-extensional vibration mode is known. Since such a piezoelectric resonator uses a harmonic in a thickness-extensional vibration, a response caused by the fundamental wave in the thickness-extensional vibration is a spurious resonance. Therefore, it is urgently needed to suppress a spurious resonance caused by the fundamental wave.

In Japanese Unexamined Patent Publication No. 4-216208, a piezoelectric resonator is disclosed which uses a third harmonic in the thickness-extensional vibration and which can suppress, via the use of floating electrodes, a spurious resonance caused by the fundamental wave.

FIG. 15 shows a structure of the piezoelectric resonator described in the above patent publication. In a piezoelectric resonator 61, a vibration electrode 63 is located at the center of the first major surface of a rectangular piezoelectric substrate 62 and a vibration electrode 64 is provided at the center of the second major surface. The vibration electrodes 63 and 64 are opposed to each other with the piezoelectric substrate 62 located therebetween.

The vibration electrode 63 is connected to a terminal electrode 65b provided along an edge at a short side of the piezoelectric substrate 62, through a lead electrode 65a. The vibration electrode 64 is electrically connected to a terminal electrode 66b provided along an edge at a short side, via a lead electrode 66a provided on the second major surface of the piezoelectric substrate 62.

On the first major surface of the piezoelectric substrate 62, floating electrodes 67a and 67b are provided along edges at a pair of long sides of the piezoelectric substrate 62, and floating electrodes 67c and 67d are provided on the second major surface such that they are opposed to the floating electrodes 67a and 67b with the piezoelectric substrate 62 located therebetween.

In the piezoelectric resonator 61, a portion where the vibration electrodes 63 and 64 are opposed to each other defines a vibration section, and the third harmonic of the thickness-extensional vibration is trapped in the vibration section. The fundamental wave is transferred from the vibration section to a surrounding area. Due to mechanical loads and piezoelectric short-circuit effects of the floating electrodes 67a to 67d, the portions where the floating electrodes 67a to 67d are located absorb the vibration energy of the fundamental wave, and an unwanted spurious resonance caused by the fundamental wave is suppressed.

Since the floating electrodes 67a to 67d need to be provided at both sides of the vibration section and extend in the short-side direction of the piezoelectric substrate 62 in the piezoelectric resonator 61, however, the piezoelectric resonator 61 cannot be made compact due to the portions where the floating electrodes 67a to 67d are located. Since the areas of the floating electrodes 67a to 67d must be large in order to guide the fundamental wave to the portions where the floating electrodes 67a to 67d are located, it is very difficult to suppress a spurious resonance caused by the fundamental wave and to make the piezoelectric resonator 61 compact at the same time.

SUMMARY OF THE INVENTION

In order to overcome the problems described above, preferred embodiments of the present invention provide a thickness-extensional piezoelectric resonator utilizing a harmonic in a thickness-extensional vibration mode, which can effectively suppress an unwanted spurious resonance caused by the fundamental wave and which can also be made compact.

A preferred embodiment of the present invention provides a piezoelectric resonator utilizing a harmonic in a thickness-extensional vibration mode, including a piezoelectric substrate, first and second excitation electrodes provided partially on a first major surface and a second major surface of the piezoelectric substrate, respectively such that they are opposed to each other via the piezoelectric substrate, first and second lead electrodes connected to the first and second excitation electrodes and extending toward edges of the piezoelectric substrate, respectively, first and second terminal electrodes connected to the first and second lead electrodes and provided along edges of the piezoelectric substrate, respectively, and a spurious suppressing electrode section connected to a portion of at least one of the first and second lead electrodes.

Since the spurious suppressing electrode section is connected to a portion of at least one of the first and second lead electrodes, which are connected to the first and second excitation electrodes, in the thickness-extensional piezoelectric resonator according to one preferred embodiment of the present invention, the fundamental wave in the thickness-extensional vibration mode is effectively led towards ends of the piezoelectric substrate by the first and second lead electrodes. Therefore, by securing the thickness-extensional piezoelectric resonator with the use of the first and second terminal electrodes connected to the first and second lead electrodes, the led fundamental wave is effectively damped, and thereby a spurious resonance caused by the fundamental wave is suppressed. Consequently, a thickness-extensional piezoelectric resonator using a harmonic in the thickness-extensional vibration mode and having excellent resonance characteristics is provided.

In contrast to the conventional thickness-extensional piezoelectric resonator which is prevented from being made compact when the fundamental wave is suppressed by the floating electrodes since it is required in the conventional thickness-extensional piezoelectric resonator that the floating electrodes be provided at both sides of the vibration section in the short-side direction of the piezoelectric substrate, the piezoelectric resonator according to preferred embodiments of the present invention is not prevented from being made compact since the spurious suppressing electrode section is connected to a portion of the lead electrodes.

In the above described piezoelectric resonator, the spurious suppressing electrode section may be arranged to extend in a direction which intersects with the direction in which the lead electrodes extend, so as to increase the width of the lead electrodes.

In this case, since the spurious suppressing electrode section is arranged to extend in a direction which intersects with the direction in which the lead electrodes extend so as to increase the width of the lead electrodes, the spurious suppressing electrode section can be easily provided in a process in which the lead electrodes are provided. In addition, the spurious suppressing electrode section can be easily provided just by increasing the width of the lead electrodes when the lead electrodes are formed. Further, even though a spurious resonance caused by the fundamental wave is suppressed, the piezoelectric resonator can still be made compact.

In the above described piezoelectric resonator, the width dimension of a portion of the lead electrodes where the spurious suppressing electrode section is provided may be equal to or more than about a half of the width dimension of the excitation electrodes.

It is preferred that the width dimension of a portion of the lead electrodes where the spurious suppressing electrode section is provided be equal to or greater than the width dimension of the excitation electrodes.

The thickness-extensional piezoelectric resonator may be configured such that the first excitation electrode has a substantially circular shape provided substantially at the center on the first major surface of the piezoelectric substrate; one substantially rectangular electrode film, including a region opposed to the first excitation electrode via the piezoelectric substrate, defines the second excitation electrode, the second lead electrode, and the second terminal electrode; and the region opposed to the first excitation electrode via the piezoelectric substrate in the one substantially rectangular electrode film functions as the second excitation electrode.

In this case, since the first excitation electrode has a substantially circular shape provided substantially at the center of the first major surface of the piezoelectric substrate; one substantially rectangular electrode film, including a region opposed to the first excitation electrode via the piezoelectric substrate, defines the second excitation electrode, the second lead electrode, and the second terminal electrode; and the region opposed to the first excitation electrode via the piezoelectric substrate, and the one substantially rectangular electrode film functions as the second excitation electrode section, a spurious resonance caused by the fundamental wave is suppressed by the spurious suppressing electrode provided at sides of the second lead electrode in the substantially rectangular electrode film, and variations in the overlapping area between the first and second excitation electrodes are significantly reduced.

Other features and advantages of the present invention will become apparent from the following description of the invention which refers to the accompanying drawings.

DETAILED DESCRIPTION OF PREFERRED EMBODIMENTS

Figure 1:
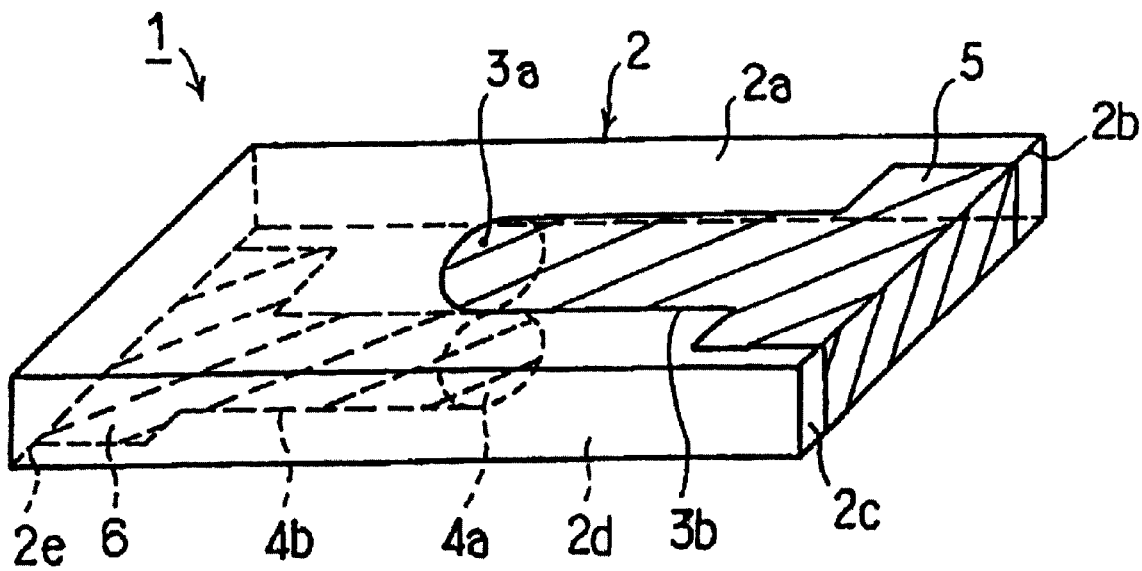
FIG. 1 is a perspective view of a piezoelectric resonator according to a first preferred embodiment of the present invention.

FIG. 1 is a perspective view of a piezoelectric resonator according to a first preferred embodiment of the present invention. A piezoelectric resonator 1 utilizing a harmonic in a thickness-extensional vibration mode preferably includes a substantially rectangular-plate-shaped piezoelectric substrate 2. The piezoelectric substrate 2 can be made, for example, from piezoelectric ceramic such as lead-zirconate-titanate ceramic or a piezoelectric single crystal such as a quartz crystal, $LiTaO_3$, and $LiNbO_3$. When the piezoelectric substrate 2 is made from piezoelectric ceramic, the substrate is polarized in the thickness direction.

On the first major surface 2a of the piezoelectric substrate 2, a first substantially rectangular excitation electrode 3a is provided substantially at the center. Connected to the first excitation electrode 3a, a lead electrode 3b is provided so as to extend from the first excitation electrode 3a toward an edge 2b at a short side of the piezoelectric substrate 2. The outer end of the lead electrode 3b is electrically connected to a terminal electrode 5 which is provided along the edge 2b at a short side of the piezoelectric substrate 2.

The first excitation electrode 3a has a substantially circular shape. A one-dot chain line indicates a boundary between the first excitation electrode 3a and the lead electrode 3b connected to the first excitation electrode 3a. In the first preferred embodiment, the width of the lead electrode 3b is preferably substantially equal to the dimension of the first excitation electrode 3a in the width direction, namely, the diameter thereof, and the lead electrode 3b is connected to the excitation electrode 3a.

In the present specification, the dimension of the first and second lead electrodes in the width direction refers to the direction that is substantially perpendicular to the direction in which the first and second lead electrodes extend.

The first terminal electrode 5 is provided along the edge 2b at a short side on the first major surface 2a of the piezoelectric substrate 2, and the width dimension thereof is preferably larger than that of the first lead electrode 3b. The first terminal electrode 5 is arranged such that it extends from the first major surface 2a of the piezoelectric substrate 2a through an end surface 2c to the second major surface 2d.

On the other hand, on the second major surface of the piezoelectric substrate 2, a second substantially circular excitation electrode 4a is provided substantially at the approximate center area. The second excitation electrode 4a is arranged such that it is opposed to the first excitation electrode 3a via the piezoelectric substrate 2. The second excitation electrode 4a is connected to a second lead electrode 4b. The dimension of the second lead electrode 4b in the width direction is preferably equal to the diameter of the second excitation electrode 4a, namely, the dimension thereof in the width direction.

The second lead electrode 4b is electrically connected to a second terminal electrode 6 which is provided along an edge 2e at a short side on the second major surface 2d of the piezoelectric substrate 2. The width dimension of the second terminal electrode 6 is preferably larger than that of the second lead electrode 4b.

Since the terminal electrodes 5 and 6 have portions located on the second major surface 2d of the piezoelectric substrate 2 in the piezoelectric resonator 1, the resonator can be easily surface-mounted, for example, on a printed circuit board so as to have the same orientation as that shown in the figure.

In the piezoelectric resonator 1, when an AC voltage is applied between the terminal electrodes 5 and 6, the vibration section, where the first and second excitation electrodes 3a and 4a are opposed to each other via the piezoelectric substrate, vibrates in the thickness-extensional vibration mode due to a piezoelectric effect. The third harmonic in the thickness-extensional vibration is trapped in the vibration section, whereas the fundamental wave in the thickness-extensional vibration is transferred toward the outside of the vibration section. Therefore, a problem is a spurious resonance caused by the vibration of the fundamental wave in the thickness-extensional vibration.

In the piezoelectric resonator I according to the first preferred embodiment, in order to suppress an unwanted spurious resonance caused by the fundamental wave, the width of the lead electrodes 3b and 4b is extended and the lead electrodes 3b and 4b are provided with spurious suppressing electrode sections. In other words, the first and second lead electrodes 3b and 4b suppress a spurious resonance caused by the fundamental wave and also electrically connect the first and second excitation electrodes 3a and 4a to the terminal electrodes 5 and 6 in the piezoelectric resonator 1 according to the first preferred embodiment.

The reason why a spurious resonance caused by the fundamental wave is effectively suppressed by increasing the width dimension of the lead electrodes 3b and 4b, namely, by providing the spurious suppressing electrode sections, is that the fundamental wave is guided to the lead electrodes 3b and 4b and is effectively led to both ends in the longitudinal direction of the piezoelectric substrate 2 by the spurious suppressing electrode sections.

On the other hand, the terminal electrodes 5 and 6 are electrically connected to and mechanically secured to the outside via an electrically conductive bonding material. Therefore, the fundamental wave is effectively led by the spurious suppressing electrode sections to the portions where the terminal electrodes 5 and 6 are provided, namely, both ends in the longitudinal direction of the piezoelectric substrate 2, and is effectively damped at the secured sections of the terminal electrodes 5 and 6. Thus, a spurious resonance caused by the fundamental wave is suppressed.

Since the spurious suppressing electrode sections are formed together with the lead electrodes 3b and 4b as units, and it is not necessary to provide floating electrodes at both sides of the vibration section in the short-side direction of the piezoelectric substrate 2, the thickness-extensional piezoelectric resonator 1 is not prevented from being made compact.

Figure 2:
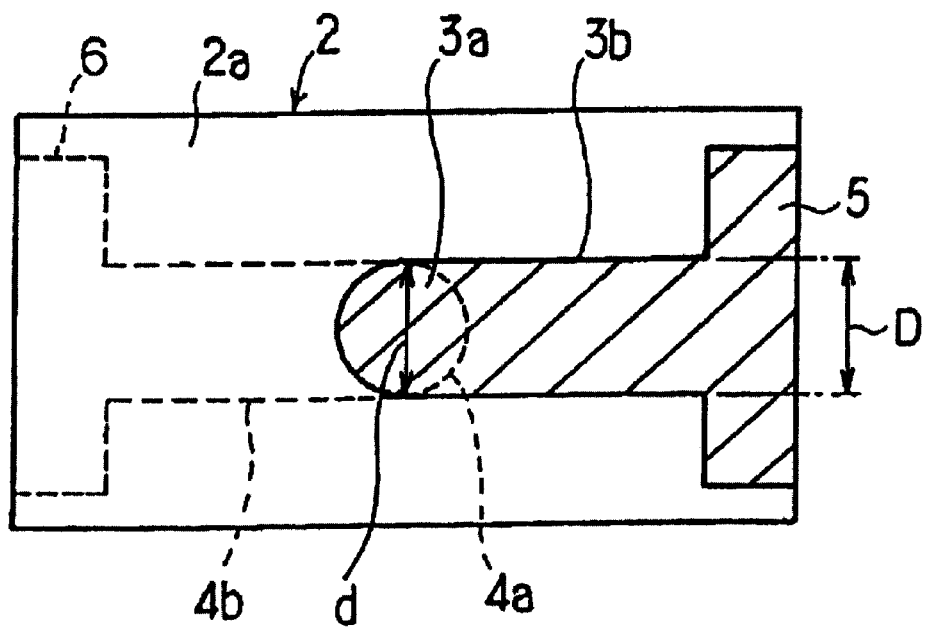
FIG. 2 is a plan view of the piezoelectric resonator according to the first preferred embodiment.

The width dimension of the lead electrodes 3b and 4b where the spurious suppressing electrode sections are provided is not restricted when a spurious resonance caused by the fundamental wave is suppressed. It is preferred that the width D of the first and second lead electrodes 3b and 4b be equal to or more than d/2, where "d" indicates the width dimension of the first and second excitation electrodes 3a and 4a as shown in FIG. 2. If D is less than d/2, the effect of the spurious suppressing electrode sections provided by increasing the width of the lead electrodes 3b and 4b, namely, the effect that a spurious resonance caused by the fundamental wave is suppressed, may be sufficient in some cases.

Figure 14:
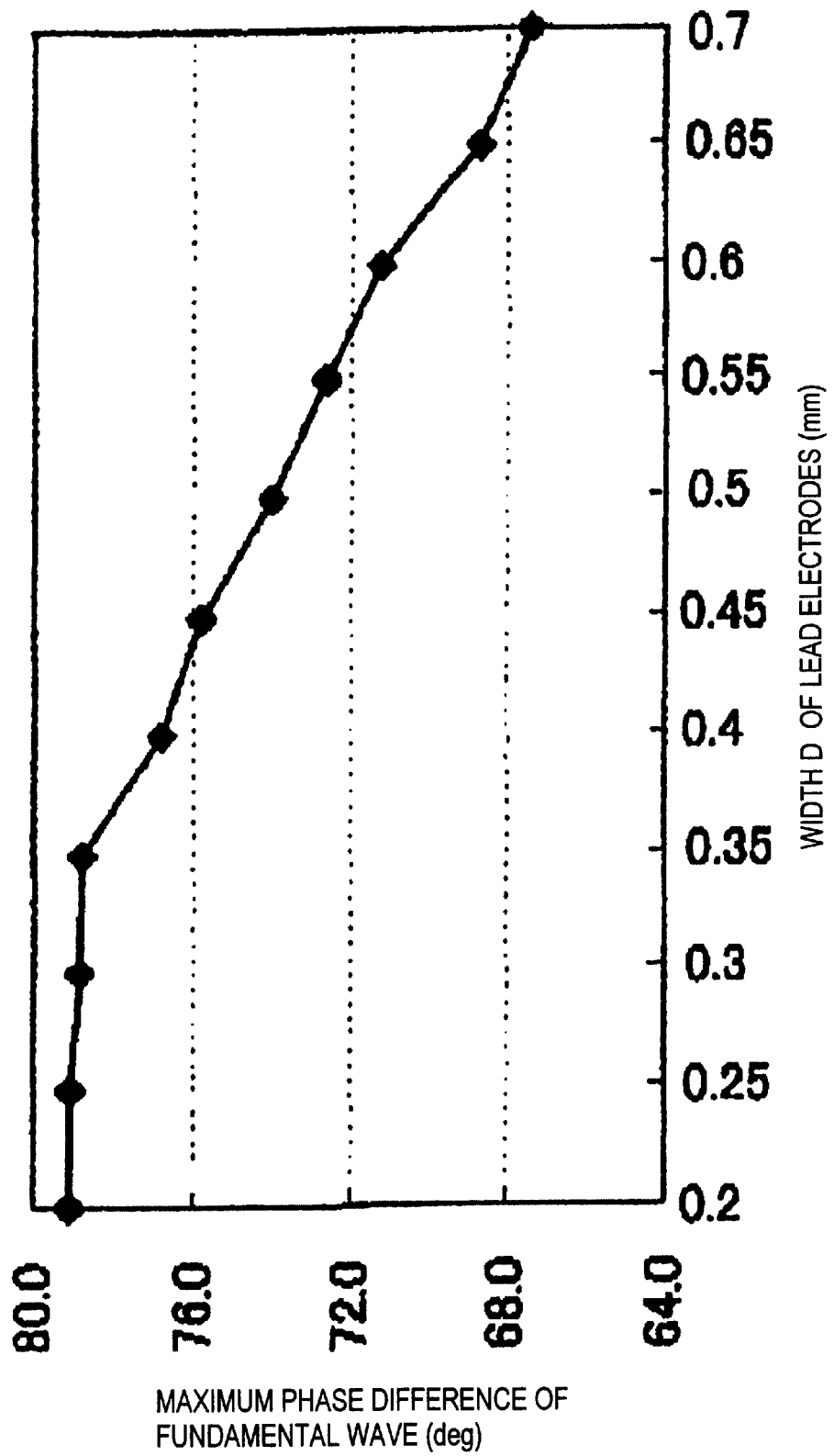
FIG. 14 is a graph showing changes in a spurious resonance caused by the fundamental wave with the width dimension D of the lead electrodes being changed in the piezoelectric resonator according to the first preferred embodiment.
Figure 15:
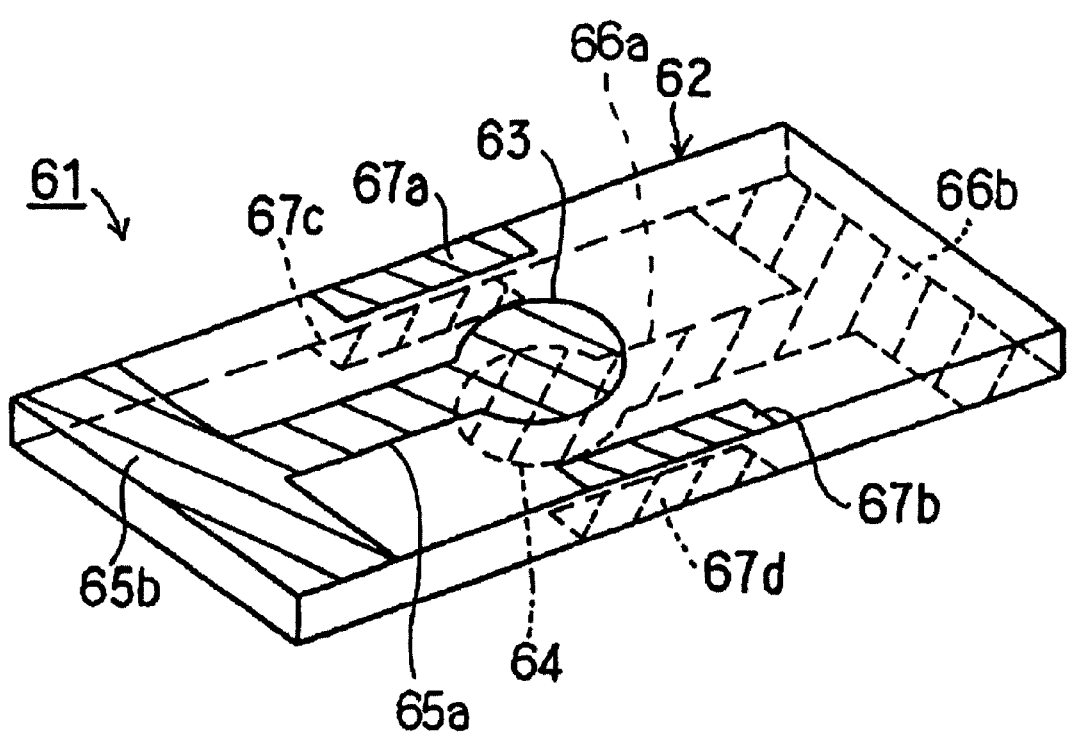
FIG. 15 is a perspective view of a conventional piezoelectric resonator utilizing a vibration in a thickness-extensional mode.

FIG. 14 shows changes in the magnitude of a spurious resonance caused by the fundamental wave with the width D of the first and second lead electrodes 3b and 4b being changed and the width dimension "d" of the first and second excitation electrodes 3a and 4a being constant. Specifically, FIG. 14 illustrates a spurious resonance caused by the fundamental wave, namely, the maximum value of the phase difference in the fundamental wave with the width D of the first and second lead electrodes 3b and 4 being changed from 0.2 mm to 0.7 mm in the example of the piezoelectric resonator 1 which measures about 2.2 mm by about 1.1 mm in its plane shape, which has a center frequency of about 30 MHz, and in which the width dimension "d" of the first and second excitation electrodes 3a and 4a is about 0.7 mm. It is clearly understood from FIG. 14 that a spurious resonance caused by the fundamental wave is reduced when D is about 0.35 mm or more.

It is more preferred that the width D of the first and second lead electrodes 3b and 4b be equal to or greater than the width dimension "d" of the first and second excitation electrodes 3a and 4a.

The effect of suppressing the spurious resonance caused by the fundamental wave which is achieved by the use of the spurious suppressing electrode sections provided for the first and second lead electrodes will be described below with reference to a specific experimental case.

Figure 3:
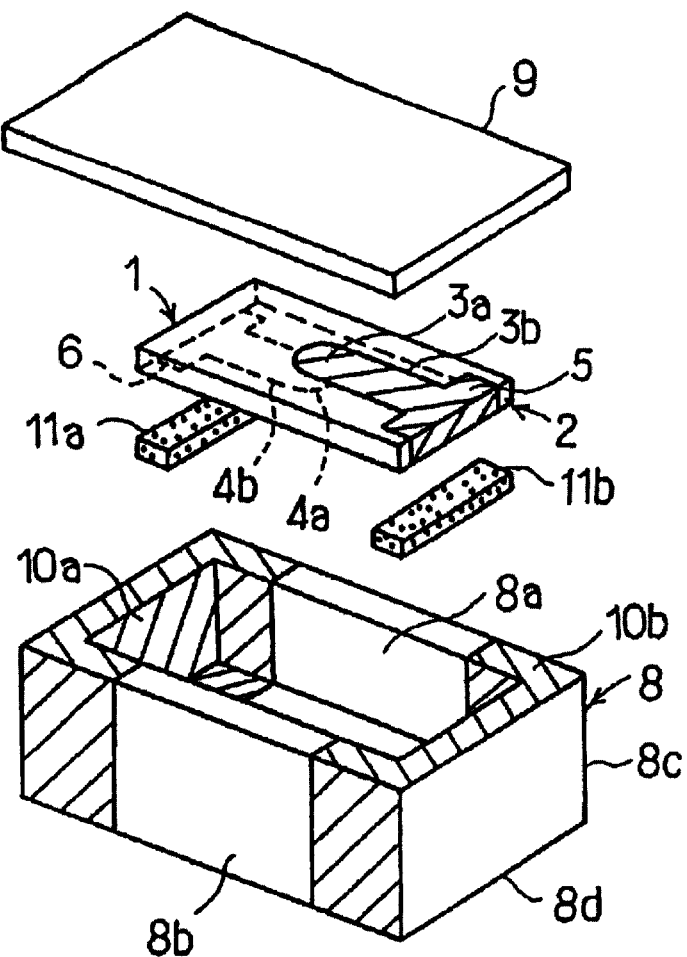
FIG. 3 is an exploded perspective view of a chip-type piezoelectric resonance component using the piezoelectric resonator according to the first preferred embodiment.
Figure 4:
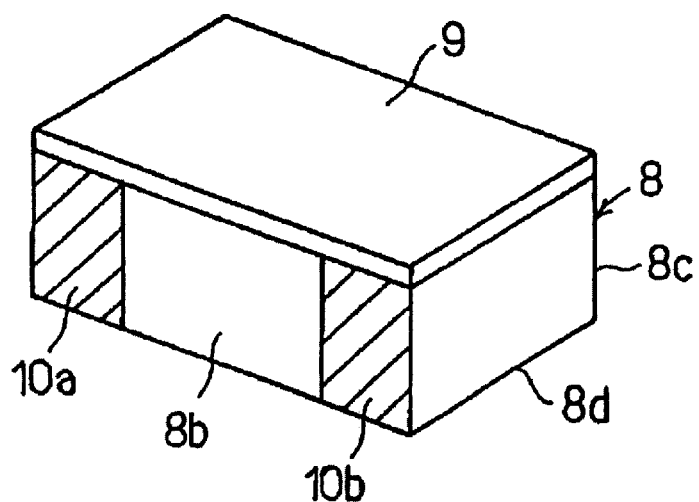
FIG. 4 is a perspective view of the chip-type piezoelectric resonance component including the piezoelectric resonator according to the first preferred embodiment.

With the use of the thickness-extensional piezoelectric resonator 1, a chip-type piezoelectric resonance component shown in FIGS. 3 and 4 is produced. A case body 8 having a substantially rectangular opening 8a at the upper portion and made from an insulating material and a flat-plate-shaped cover 9 made from an insulating material define a case. The thickness-extensional piezoelectric resonator 1 is disposed within the case.

The case body 8 is provided with external electrodes 10a and 10b. The external electrodes 10a and 10b are provided in the vicinities of both ends of the case body 8 in the longitudinal direction, and extend to the inside of the opening 8a, to a pair of side surfaces 8b and 8c, and to the second major surface 8d of the case body 8.

In the inside of the opening 8a of the case body 8, the piezoelectric resonator 1 is bonded via electrically conductive bonding members 11a and 11b. The terminal electrode 6 is connected to the external electrode 10a via the electrically conductive bonding member 11a, and the terminal electrode 5 is connected to the external electrode 10b via the electrically conductive bonding member 11b.

The cover 9 is bonded to the case body 8 via an insulating bonding member (not shown) to seal the case. Since the external electrodes 10a and 10b are provided so as to extend to the side surfaces 8b and 8c and to the second major surface 8d of the body case 8, the chip-type piezoelectric resonance component 11 obtained as described above can be easily surface-mounted on a printed circuit board.

In the piezoelectric resonator 1, the fundamental wave is effectively led to both ends of the piezoelectric substrate 2 via the first and second lead electrodes 3b and 4b provided with the spurious suppressing electrode sections, as described above. In addition, since the vicinities of both ends of the piezoelectric substrate 2 are bonded to the case body 8 via the electrically conductive bonding members 11a and 11b, a leaked fundamental wave is effectively damped by this securing mechanism. Therefore, an unwanted spurious resonance caused by the fundamental wave can be effectively suppressed.

Figure 5:
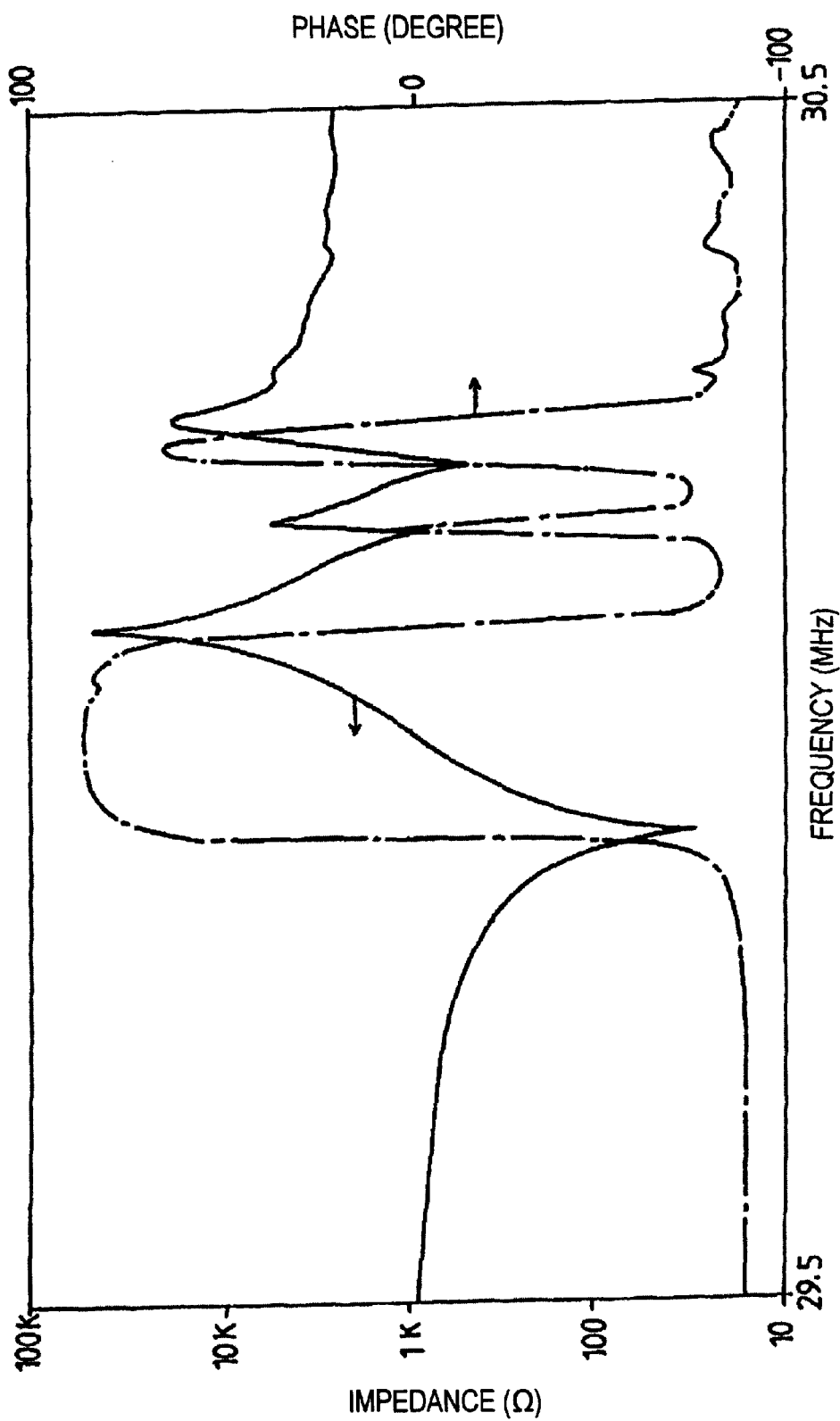
FIG. 5 is a graph showing resonance characteristics for describing responses of the third harmonic in a thickness-extensional vibration mode in the chip-type piezoelectric resonance component including the piezoelectric resonator according to the first preferred embodiment.
Figure 6:
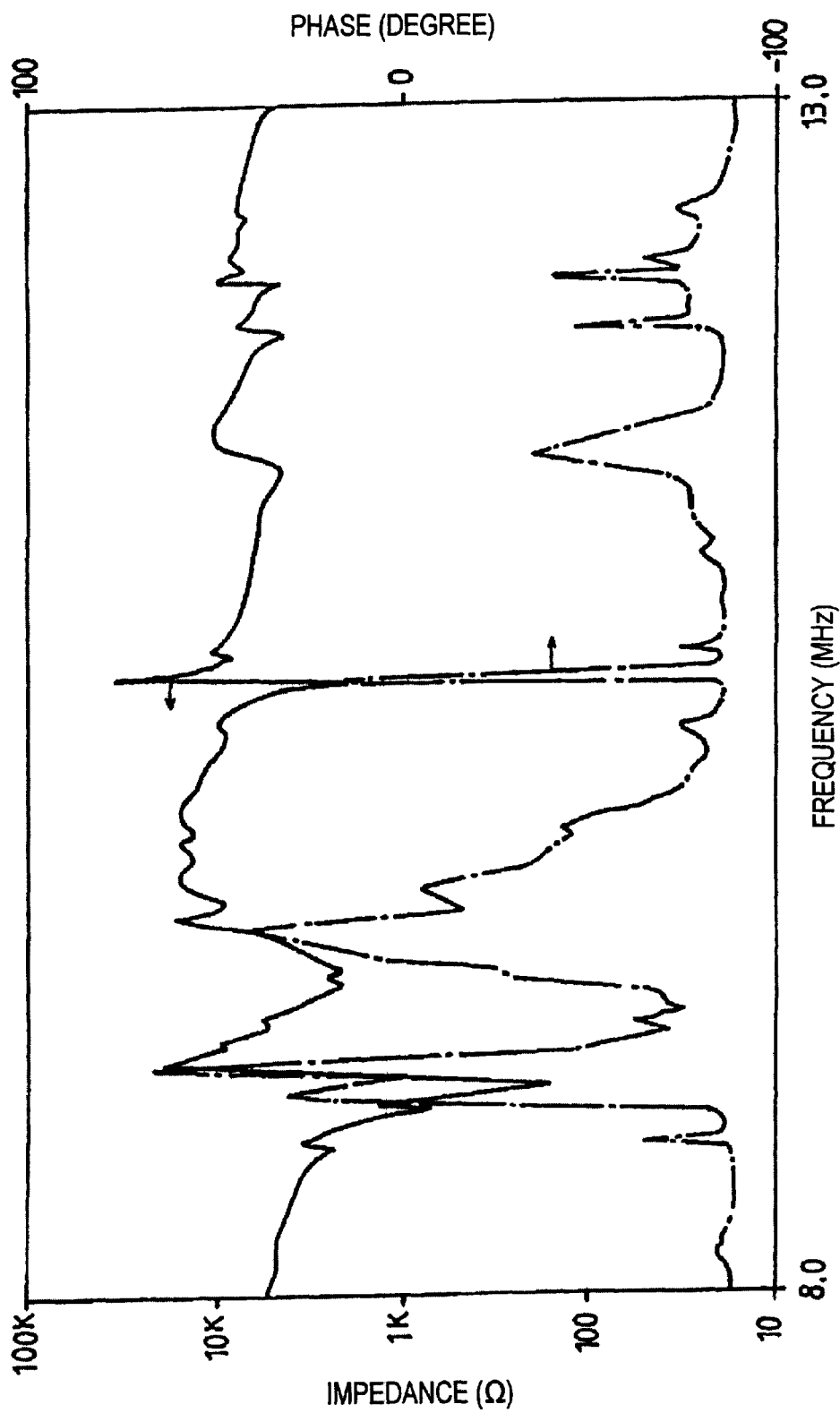
FIG. 6 is a graph showing resonance characteristics for describing responses of the fundamental wave in the chip-type piezoelectric resonance component including the thickness-extensional piezoelectric resonator according to the first preferred embodiment.

An example of the foregoing chip-type piezoelectric resonance component was formed with the following specifications, and responses of the third harmonic and fundamental waves in thickness-extensional vibration mode were measured. FIGS. 5 and 6 show measurement results. The thickness-extensional piezoelectric resonator 1 had a piezoelectric substrate made from lead titanate measuring about 2.2 mm by about 1.1 mm by about 0.25 mm (thickness). The diameter of first and second excitation electrodes 3a and 4a was about 0.7 mm. The resonator 1 was formed such that the third harmonic wave in thickness-extensional vibration appears at a frequency of about 30 MHz.

Figure 7:
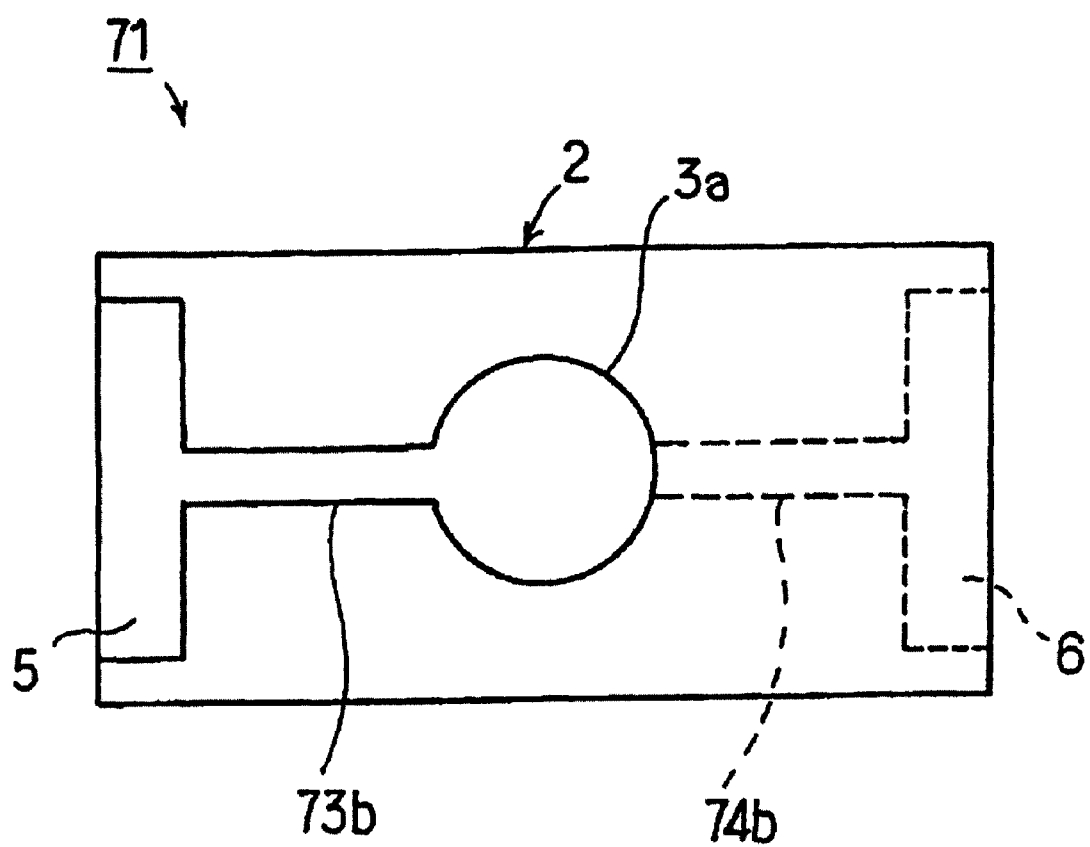
FIG. 7 is a plan of a piezoelectric resonator for comparison.

For comparison, a thickness-extensional piezoelectric resonator 71 shown in FIG. 7, which did not have a spurious suppressing electrode section was produced. A chip type piezoelectric resonance component was produced in the same way with the use of a case body 8, a case 9, and electrically conductive bonding members 11a and 11b, and its characteristics were measured. The piezoelectric resonator 71 utilizing a harmonic in a thickness-extensional vibration mode, shown in FIG. 7 for comparison, used the same piezoelectric substrate as the piezoelectric resonator 1 in the present preferred embodiment. The diameter of first and second excitation electrodes were set to 0.7 mm in the same way as for the present preferred embodiment. In other words, the piezoelectric resonator 71 was formed in the same way as for the piezoelectric resonator 1 except that the width of lead electrodes 73 and 74 were set to 0.3 mm.

Figure 8:
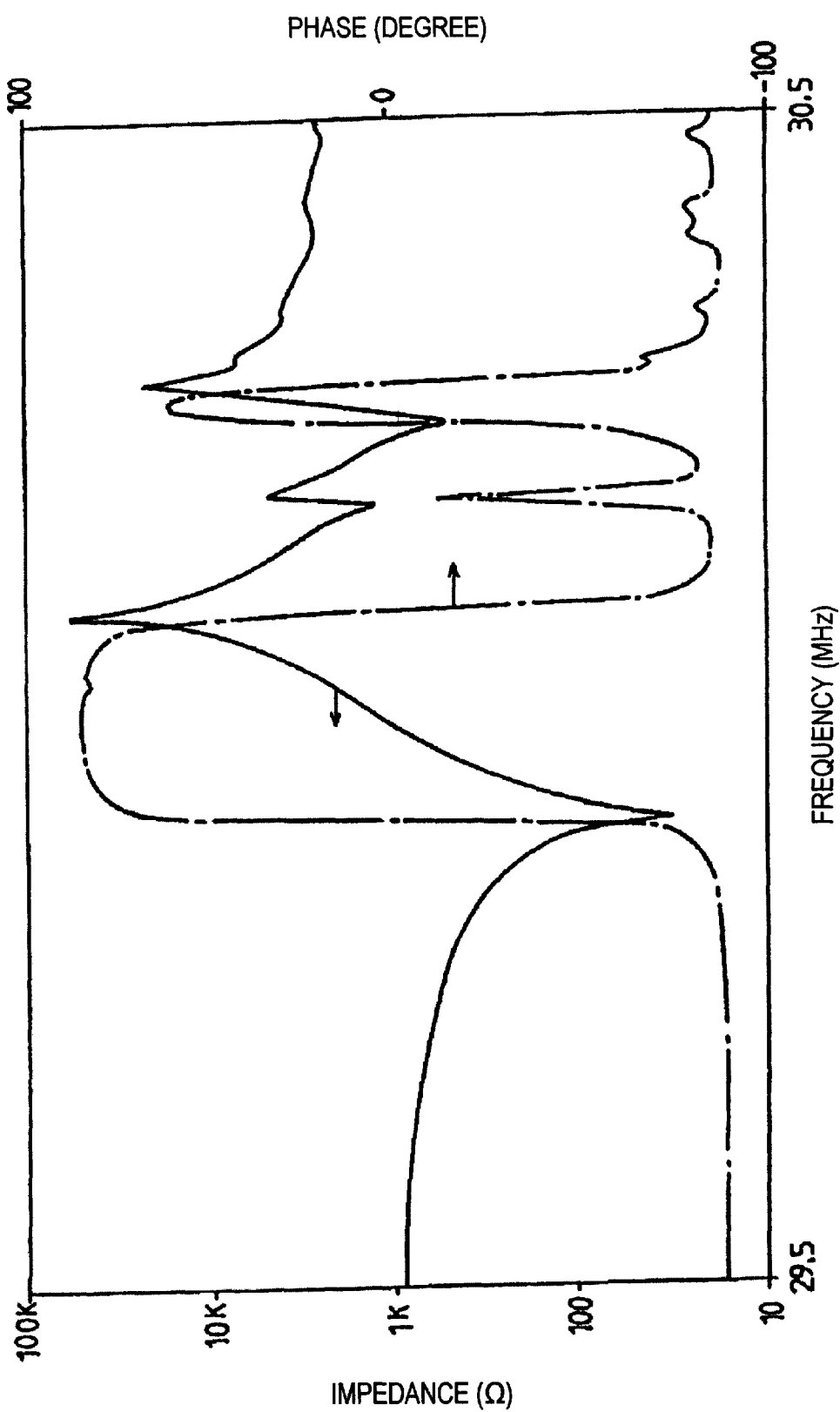
FIG. 8 is a graph showing resonance characteristics for describing responses of the third harmonic in a thickness-extensional vibration in a chip-type piezoelectric resonance component using the piezoelectric resonator for comparison.
Figure 9:
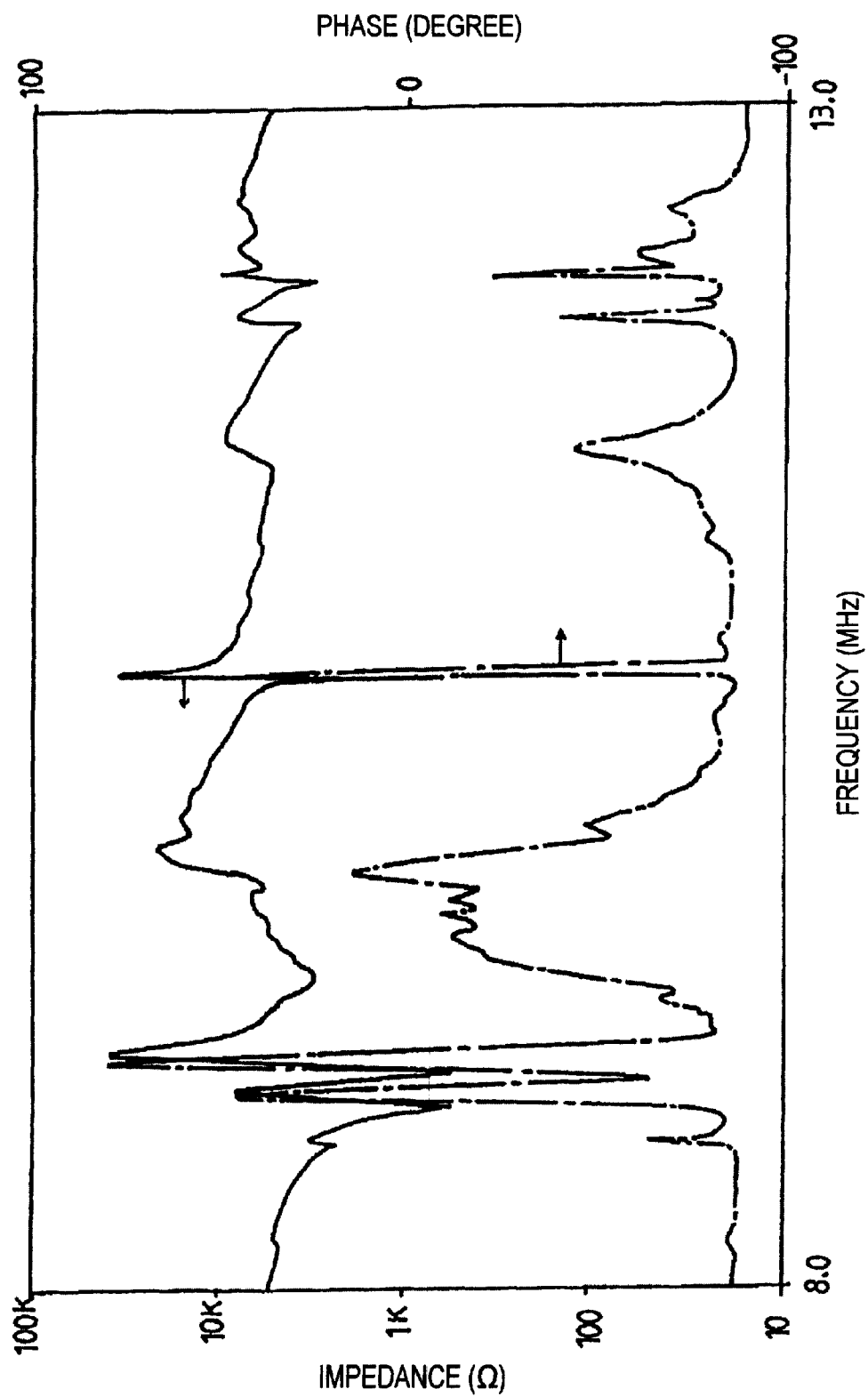
FIG. 9 is a graph showing resonance characteristics for describing responses of the fundamental wave in the thickness-extensional vibration in the chip-type piezoelectric resonance component using the piezoelectric resonator for comparison.

FIGS. 8 and 9 show responses of the third harmonic and fundamental waves in a thickness-extensional vibration mode in the chip-type piezoelectric resonance component used for comparison, respectively.

It is clear from comparison between the characteristics shown in FIGS. 8 and 9 and those shown in FIGS. 5 and 6 that the maximum phase of a spurious resonance caused by the fundamental wave was as low as 61.5 degrees in the present preferred embodiment whereas the maximum phase of a spurious resonance caused by the fundamental wave was as high as 78.6 degrees in the thickness-extensional piezoelectric resonator 71 used for comparison. Therefore, it is clear that a spurious resonance caused by the fundamental wave was effectively suppressed.

The materials used for the first and second excitation electrodes, the first and second lead electrodes, and the first and second terminal electrodes are not limited. Appropriate electrode materials conventionally used for a piezoelectric resonator, such as Ag, Cu, and an Ag—Pd alloy, can be used.

The shape of the first and second excitation electrodes is not limited to substantially circular when viewed from the top in the present preferred embodiment. It can be any shape, such as a square or rectangle or other geometrical shape.

Figure 10:
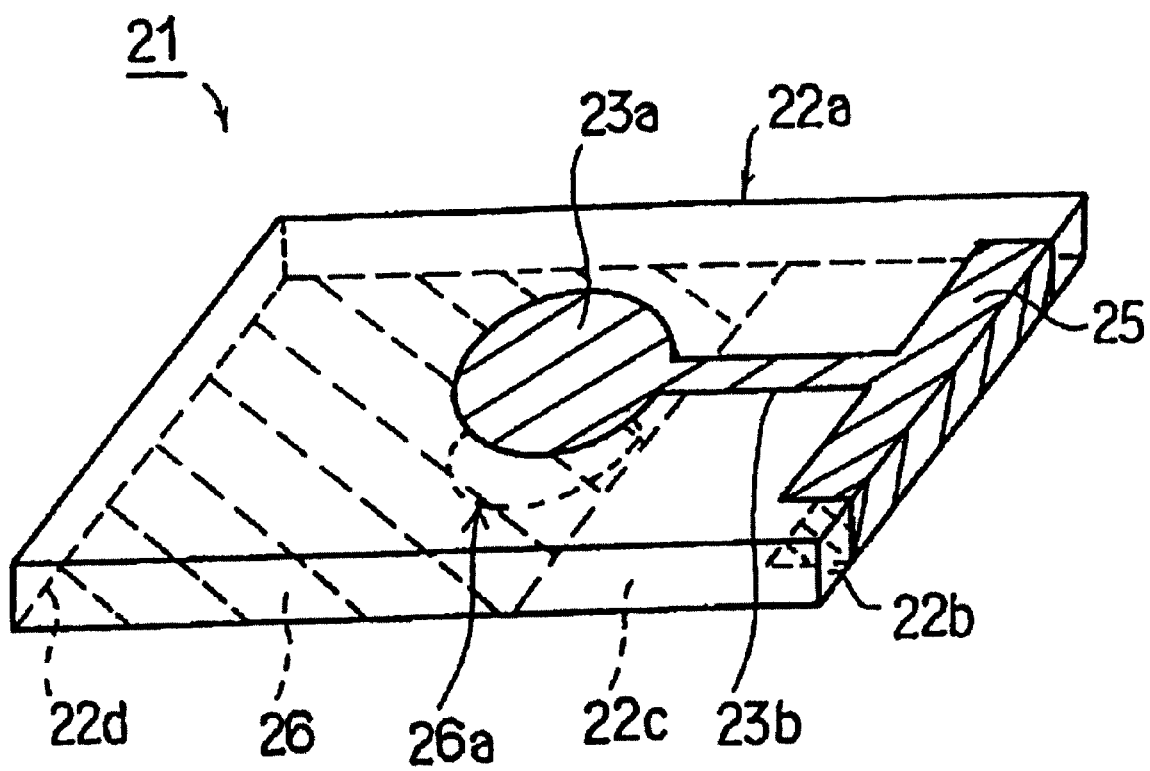
FIG. 10 is a perspective view of a piezoelectric resonator according to a second preferred embodiment of the present invention.

FIG. 10 is a perspective view of a piezoelectric resonator utilizing a harmonic in a thickness-extensional vibration mode, according to a second preferred embodiment of the present invention. In the piezoelectric resonator 21 according to the second preferred embodiment, a lead electrode provided with a spurious suppressing electrode section is provided only on one major surface of a piezoelectric substrate 22.

Substantially at the center of the first major surface 22a of the piezoelectric substrate 22, a first excitation electrode 23a having a substantially circular shape is provided. The first excitation electrode 23a is connected to a terminal electrode 25 through a lead electrode 23b. The terminal electrode 25 is provided so as to extend from the first major surface 22a of the piezoelectric substrate 22 to the second major surface 22c via a side surface 22b.

On the other hand, on the second major surface 22c of the piezoelectric substrate 22, a substantially rectangular electrode 26 is arranged to extend from an edge 22d at a short side of the piezoelectric substrate 22 to the approximate center with a width dimension equal to the entire width of the piezoelectric substrate 22. The electrode 26 is extended to a position where it is opposed to the first excitation electrode 23a via the piezoelectric substrate 22. In the second preferred embodiment, an electrode section which is opposed to the first excitation electrode 23a via the piezoelectric substrate 22, namely, a substantially circular electrode section 26a shown in FIG. 10, defines a second excitation electrode in the electrode 26. Within the electrode 26, a section in the vicinity of the edge 22d defines a terminal electrode section for connecting to the outside. The other section, namely, a section connecting the terminal electrode section to the second excitation electrode section 26a, defines a second lead electrode and a spurious suppressing electrode section connected thereto in the direction in which the second lead electrode extends.

In other words, in the piezoelectric resonator 21, the excitation electrode 23a and the lead electrode 23b are provided on the first major surface 22a of the piezoelectric substrate 22 in the same way as for the conventional piezoelectric resonator utilizing a harmonic in a thickness-extensional vibration mode, whereas the second lead electrode connected to the spurious suppressing electrode according to preferred embodiments of the present invention is provided on the second major surface of the piezoelectric substrate 22.

Also in the second preferred embodiment, when an AC voltage is applied between the terminal electrode 25 and the electrode 26, a vibration section (a section where the first excitation electrode 23a is opposed to the second excitation electrode section 26a on the front and rear surfaces) vibrates in a thickness-extensional vibration mode, and the third harmonic in the thickness-extensional vibration is effectively trapped in the vibration section. The fundamental wave in the thickness-extensional vibration is transferred to the outside of the vibration section. Since the substantially rectangular electrode 26 is formed, in other words, since the second lead electrode and the spurious suppressing electrode formed together with the second lead electrode are provided, the fundamental wave is effectively guided to the edge 22d. Therefore, when the electrode 26 is secured in the vicinity of the edge 22d, the fundamental wave is damped, and thereby a spurious resonance caused by the fundamental wave is effectively suppressed.

It will be described according to a specific example that a spurious resonance caused by the fundamental wave can be effectively suppressed in the piezoelectric resonator 21.

The example of the piezoelectric resonator 21 was produced according to the following specifications. With the use of the same piezoelectric substrate as that used in the experimental case in the first preferred embodiment, a first substantially circular excitation electrode 23a with a diameter of about 0.7 mm and a first lead electrode 23b which was about 0.3 mm wide were provided on the first major surface. In other words, the electrode structure on the first major surface is the same as that for the above described comparison case. A substantially rectangular electrode 26 with a width of about 1.1 mm and a length of about 1.45 mm was provided on the second major surface of the piezoelectric substrate 22.

Figure 11:
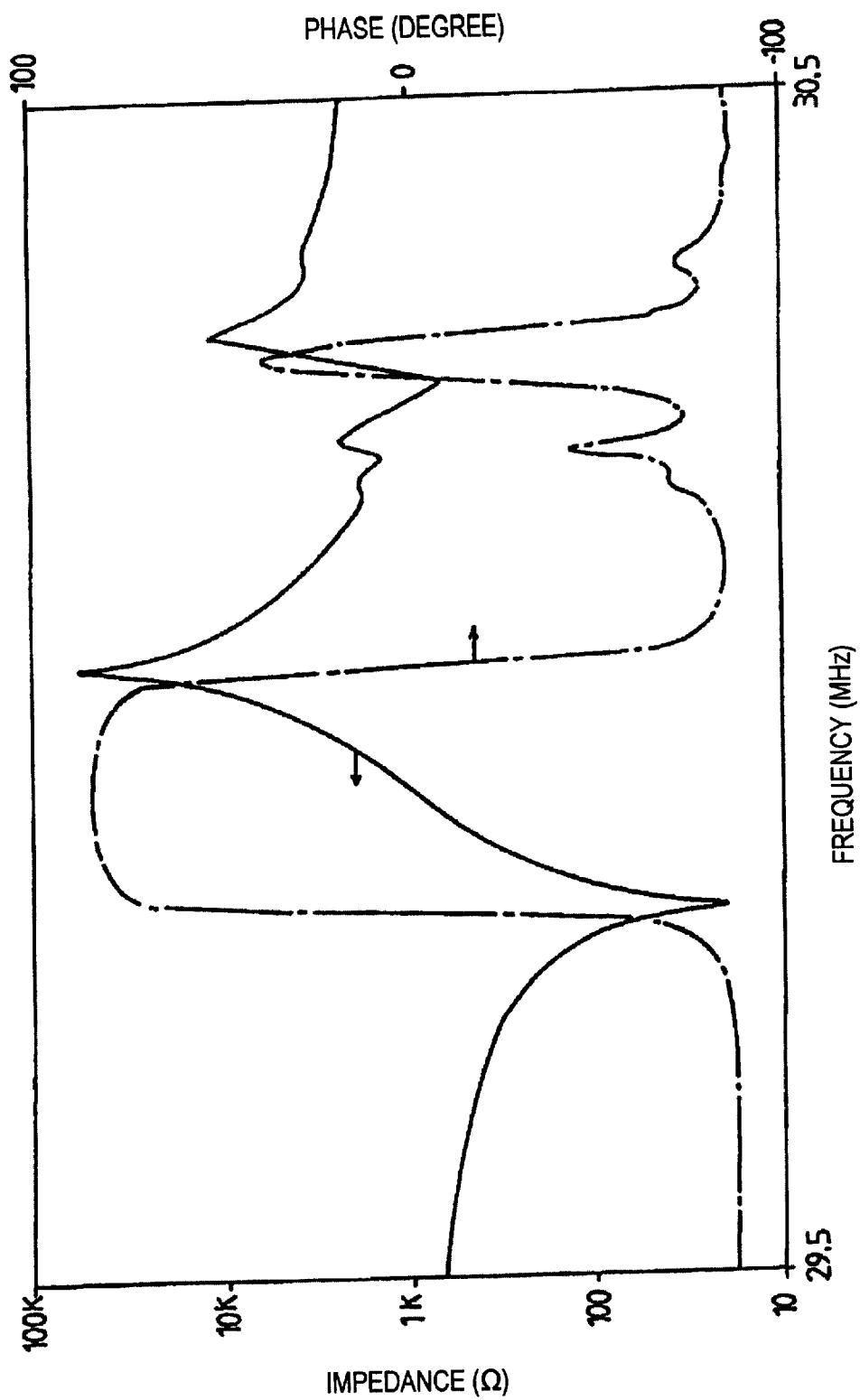
FIG. 11 is a graph showing resonance characteristics for describing responses of the third harmonic in a thickness-extensional vibration in a chip-type piezoelectric resonance component using the piezoelectric resonator according to the second preferred embodiment.
Figure 12:
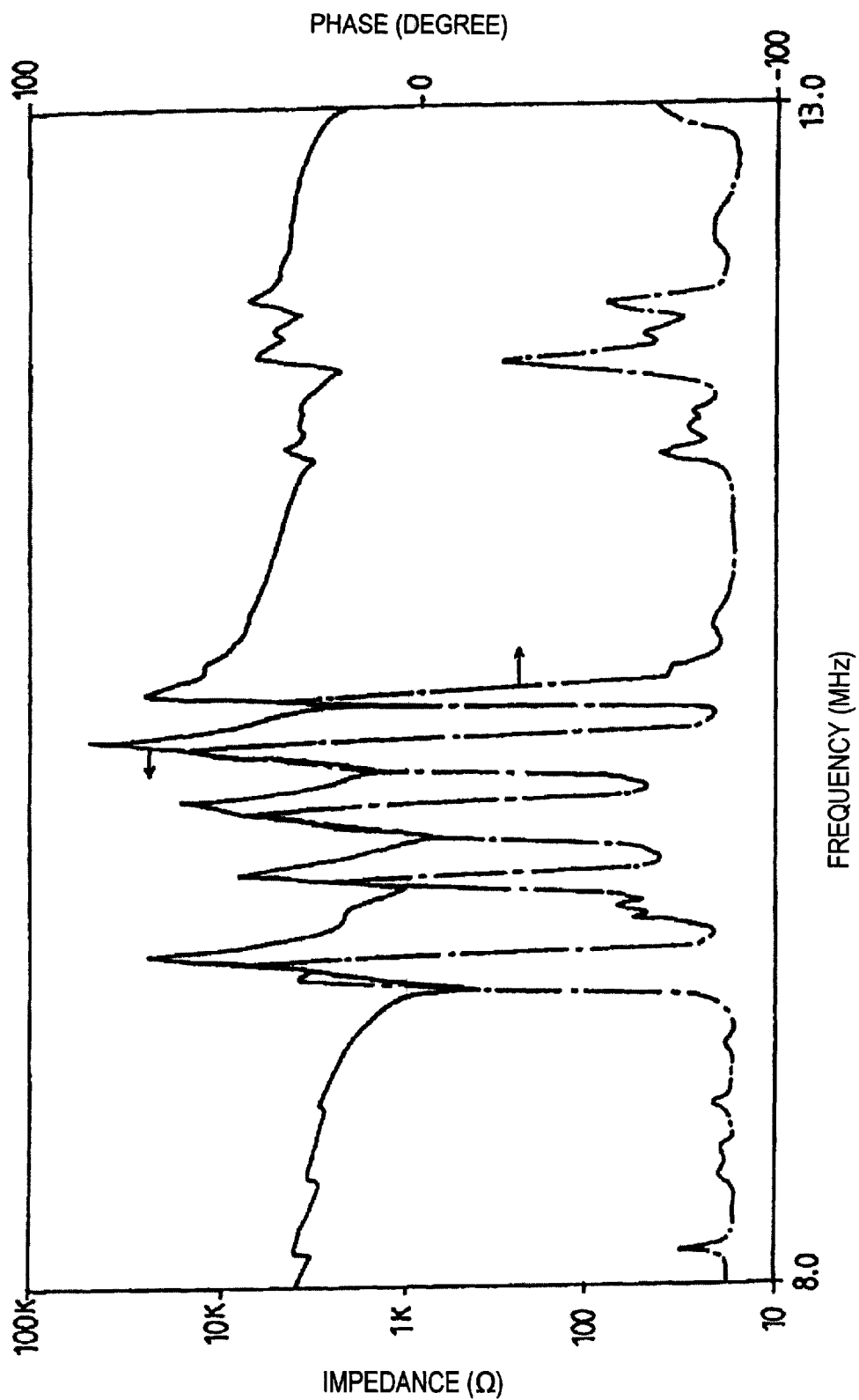
FIG. 12 is a graph showing resonance characteristics for describing responses of the fundamental wave in the thickness-extensional vibration in the chip-type piezoelectric resonance component using the thickness-extensional piezoelectric resonator according to the second preferred embodiment.

By the use of this piezoelectric resonator produced in the foregoing way, which had a third-harmonic frequency of 34 MHz, a chip-type component was produced in the same way as for the chip-type piezoelectric resonance component shown in FIGS. 3 and 4, and its characteristics were measured. FIGS. 11 and 12 show responses of the third harmonic and fundamental waves in a thickness-extensional vibration.

It is clearly understood from FIG. 12 that the maximum phase of a spurious resonance caused by the fundamental wave was as low as 57 degrees when the piezoelectric resonator 21 according to the second preferred embodiment was used, and a spurious resonance caused by the fundamental wave can be effectively suppressed as compared with a case in which the above-described piezoelectric resonator used for comparison was used.

Since the electrode 26 provided on the second major surface has a substantially rectangular shape and is provided with the entire width of the second major surface of the piezoelectric substrate 22 in the piezoelectric resonator 21 according to the second preferred embodiment, overlapping precision between the excitation electrode 23a and the second excitation electrode section 26a is increased.

Figure 13A:
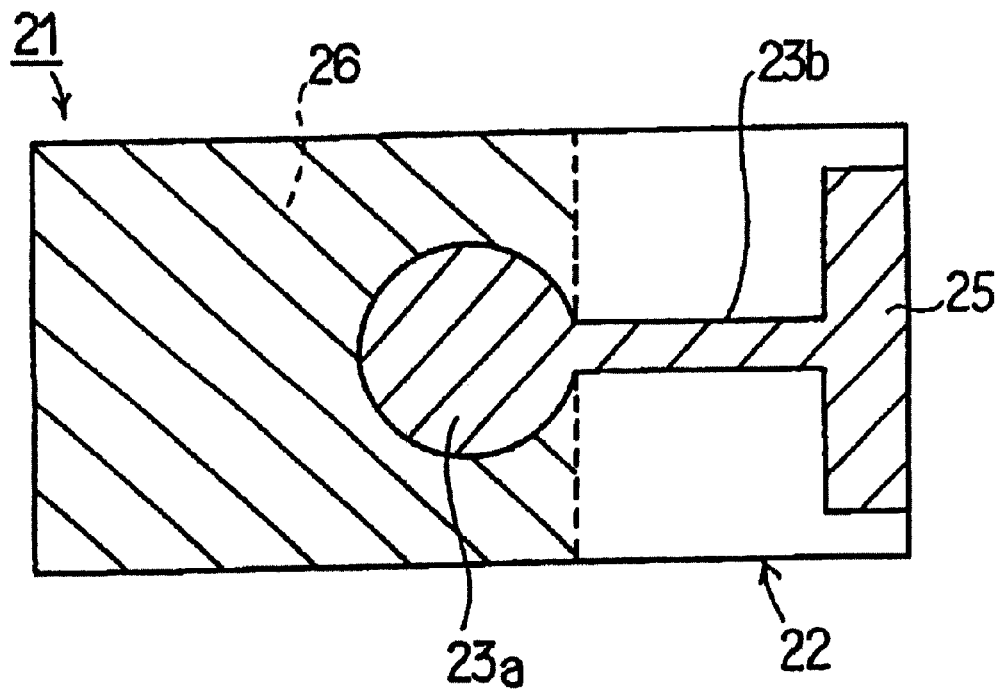
FIGS. 13A and 13B are plan views illustrating the overlapping conditions of excitation electrodes in the piezoelectric resonator according to the second preferred embodiment.
Figure 13B:
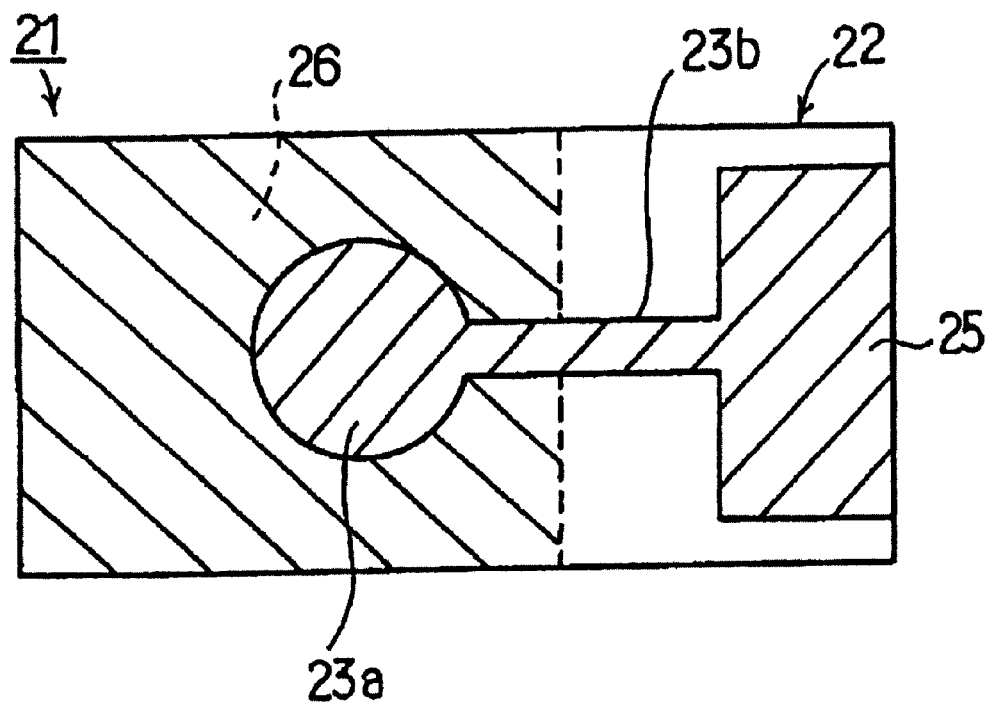

Even when the printed positions of the first excitation electrode 23a, the lead electrode 23b, and the terminal electrode 25 are shifted in the longitudinal direction of the piezoelectric substrate 22 from those in the case shown in FIG. 13A in which the first excitation electrode 23a correctly overlaps with the substantially rectangular electrode 26, the location of the vibration section does not change if the first excitation electrode 23a is in a position where it is opposed to the substantially rectangular electrode 26. In other words, since a part of the substantially rectangular electrode 26 defines one excitation electrode, the precision of the overlapping area between the electrode 26 and the first excitation electrode 23a can be increased, or the tolerance in printing the first excitation electrode 23a can be extended.

Even when the printed position of the first excitation electrode 23a is shifted in the width direction of the first excitation electrode 23a, a vibration section having the desired area can be reliably obtained if the section formed by projecting the first excitation electrode 23a downward falls in the substantially rectangular electrode 26.

In the present invention, to increase the spurious suppressing effect caused by the spurious suppressing electrode section, a resin layer may be laminated on the spurious suppressing electrode section to increase the damping effect. An appropriate resin, such as epoxy resin or silicone resin, can be used for such a resin layer. It is preferred that adhesive, such as silicone adhesive and epoxy adhesive, be used since it is easily formed on-the spurious suppressing electrode section.

While the invention has been particularly shown and described with reference to preferred embodiments thereof, it will be understood by those skilled in the art that the forgoing and other changes in form and details may be made therein without departing from the spirit of the invention.

What is claimed is:

1. A piezoelectric resonator utilizing a harmonic in a thickness-extensional vibration mode, comprising:
   a piezoelectric substrate having a first major surface and a second major surface;
   first and second excitation electrodes provided partially on said first major surface and said second major surface of said piezoelectric substrate, respectively such that the first and second excitation electrodes are opposed to each other via said piezoelectric substrate;
   first and second lead electrodes connected to said first and second excitation electrodes and extending toward edges of said piezoelectric substrate, respectively;
   first and second terminal electrodes connected to said first and second lead electrodes and provided along edges of said piezoelectric substrate, respectively; and
   a spurious suppressing electrode section connected to a portion of at least one of said first and second lead electrodes; wherein
   at least one of said first and second lead electrodes is integral with said spurious suppressing electrode section, said spurious suppressing electrode section being arranged to extend in a direction that intersects with a direction in which said lead electrodes extend so as to increase the width of said lead electrodes.

2. A piezoelectric resonator according to claim 1, wherein a width dimension of a portion of said lead electrodes where said spurious suppressing electrode section is provided is equal to or greater than a half of the width dimension of said excitation electrodes.

3. A piezoelectric resonator according to claim 1, wherein a width dimension of a portion of said lead electrodes where said spurious suppressing electrode section is provided is equal to or greater than the width dimension of said excitation electrodes.

4. A piezoelectric resonator according to claim 1, wherein said first excitation electrode has a substantially circular shape provided substantially at the center on the first major surface of said piezoelectric substrate;

one substantially rectangular electrode film, including a region opposed to said first excitation electrode via said piezoelectric substrate, constitutes said second excitation electrode, said second lead electrode, and said second terminal electrode; and a region opposed to said first excitation electrode via said piezoelectric substrate, in said one substantially rectangular electrode film defines said second excitation electrode.

5. A piezoelectric resonator according to claim 1, wherein longer side edges of said piezoelectric substrate do not have electrodes disposed thereon.

6. A piezoelectric resonator according to claim 1, wherein said first and second terminal electrodes extend along shorter side edges of said piezoelectric substrate.

7. A piezoelectric resonator according to claim 1, wherein the first and second excitation electrodes have a substantially circular shape.

8. A piezoelectric resonator, comprising:

a piezoelectric substrate having a first major surface and a second major surface;

first and second excitation electrodes provided on said first major surface and said second major surface of said piezoelectric substrate, respectively such that the first and second excitation electrodes are opposed to each other via said piezoelectric substrate;

first and second lead electrodes connected to said first and second excitation electrodes and extending toward edges of said piezoelectric substrate, respectively;

first and second terminal electrodes connected to said first and second lead electrodes and provided along edges of said piezoelectric substrate, respectively; and a spurious suppressing electrode section arranged on the substrate such that a fundamental wave is guided to the first and second lead electrodes and let to both shorter ends of the piezoelectric substrate by the spurious suppressing electrode section; wherein at least one of said first and second lead electrode,s is integral with said spurious suppressing electrode section, said spurious suppressing electrode section being arranged to extend in a direction that intersects with a direction in which said lead electrodes extend so as to increase the width of said lead electrodes.

9. A piezoelectric resonator according to claim 8, wherein a width dimension of a portion of said lead electrodes where said spurious suppressing electrode section is provided is equal to or greater than a half of the width dimension of said excitation electrodes.

10. A piezoelectric resonator according to claim 8, wherein a width dimension of a portion of said lead electrodes where said spurious suppressing electrode section is provided is equal to or greater than the width dimension of said excitation electrodes.

11. A piezoelectric resonator according to claim 8, wherein said first excitation electrode has a substantially circular shape provided substantially at the center on the first major surface of said piezoelectric substrate;

one substantially rectangular electrode film, including a region opposed to said first excitation electrode via said piezoelectric substrate, constitutes said second excitation electrode, said second lead electrode, and said second terminal electrode; and a region opposed to said first excitation electrode via said piezoelectric substrate, in said one substantially rectangular electrode film defines said second excitation electrode.

12. A piezoelectric resonator according to claim 8, wherein longer side edges of said piezoelectric substrate do not have electrodes disposed thereon.

13. A piezoelectric resonator according to claim 8, wherein said first and second terminal electrodes extend along shorter side edges of said piezoelectric substrate.

14. A piezoelectric resonator according to claim 8, wherein each of the first and second excitation electrodes has a substantially circular shape.

15. A piezoelectric resonator, comprising:

a piezoelectric substrate having a first major surface and a second major surface;

first and second excitation electrodes provided on said first major surface and said second major surface of said piezoelectric substrate, respectively such that the first and second excitation electrodes are opposed to each other via said piezoelectric substrate;

first and second lead electrodes connected to said first and second excitation electrodes and extending toward edges of said piezoelectric substrate, respectively;

first and second terminal electrodes connected to said first and second lead electrodes and provided along edges of said piezoelectric substrate, respectively; and a spurious suppressing electrode section arranged on the substrate such that a fundamental wave produced in the piezoelectric substrate during vibration thereof is guided to the first and second terminal electrodes by the spurious suppressing electrode section; wherein at least one of said first and second lead electrodes is integral with said spurious suppressing electrode section, said spurious suppressing electrode section being arranged to extend in a direction that intersects with a direction in which said lead electrodes extend so as to increase the width of said lead electrodes.

16. A piezoelectric resonator according to claim 15, wherein a width dimension of a portion of said lead electrodes where said spurious suppressing electrode section is provided is equal to or greater than a half of the width dimension of said excitation electrodes.

17. A piezoelectric resonator according to claim 15, wherein a width dimension of a portion of said lead electrodes where said spurious suppressing electrode section is provided is equal to or greater than the width dimension of said excitation electrodes.

* * * * *